United States Patent
Seo

(10) Patent No.: US 11,307,793 B2
(45) Date of Patent: Apr. 19, 2022

(54) MEMORY CONTROLLER, AND METHOD THEREOF

(71) Applicant: SILICON WORKS CO., LTD., Daejeon (KR)

(72) Inventor: Jang Won Seo, Daejeon (KR)

(73) Assignee: SILICON WORKS CO., LTD., Daejeon (KR)

( * ) Notice: Subject to any disclaimer, the term of this patent is extended or adjusted under 35 U.S.C. 154(b) by 0 days.

(21) Appl. No.: 16/951,228

(22) Filed: Nov. 18, 2020

(65) Prior Publication Data

US 2021/0191645 A1 Jun. 24, 2021

(30) Foreign Application Priority Data

Dec. 23, 2019 (KR) .......................... 10-2019-0173306

(51) Int. Cl.
*G06F 3/06* (2006.01)

(52) U.S. Cl.
CPC .......... *G06F 3/0653* (2013.01); *G06F 3/0629* (2013.01); *G06F 3/0659* (2013.01); *G06F 3/0679* (2013.01)

(58) Field of Classification Search
CPC ............................................. G06F 3/06–0689
See application file for complete search history.

(56) References Cited

U.S. PATENT DOCUMENTS

| | | | | |
|---|---|---|---|---|
| 6,070,252 A * | 5/2000 | Xu | ...................... | G01R 31/3183 714/30 |
| 6,230,290 B1 * | 5/2001 | Heidel | ................... | G11C 29/16 714/718 |
| 6,658,611 B1 * | 12/2003 | Jun | ......................... | G11C 29/16 714/719 |
| 7,036,064 B1 * | 4/2006 | Kebichi | ........... | G11C 29/12015 714/731 |
| 7,178,076 B1 * | 2/2007 | Zarrineh | ................ | G11C 29/16 365/201 |
| 7,293,199 B1 * | 11/2007 | Zarrineh | ................ | G11C 29/16 714/30 |

(Continued)

FOREIGN PATENT DOCUMENTS

| | | |
|---|---|---|
| KR | 10-1714630 B1 | 3/2017 |
| KR | 10-2019-0000663 A | 1/2019 |
| KR | 10-2019-0065805 A | 6/2019 |

*Primary Examiner* — Nicholas J Simonetti
(74) *Attorney, Agent, or Firm* — Harness, Dickey & Pierce, P.L.C.

(57) ABSTRACT

A memory controller according to an aspect of the present invention includes a buffer configured to store an operation command table including operation commands entered by a user, a BIST (built-in self-tester) controller configured to generate a pointer pointing to an operation command, a command and address generator configured to decode the operation command corresponding to the pointer among the operation commands to generate first memory commands, a command and address queue comprising queues for storing the first memory commands, and a command requester configured to output a test command including first operation command information for the generation of a memory command output from a first queue included in the queues among the memory command, location information of the first queue, and the operation commands.

10 Claims, 3 Drawing Sheets

(56) References Cited

U.S. PATENT DOCUMENTS

| | | | |
|---|---|---|---|
| 2002/0194545 A1* | 12/2002 | Abbott | G11C 29/26 |
| | | | 714/42 |
| 2004/0078608 A1* | 4/2004 | Kanapathippillai | G06F 9/383 |
| | | | 713/300 |
| 2018/0174665 A1* | 6/2018 | Kraipak | G11C 29/02 |
| 2020/0143902 A1* | 5/2020 | Jain | G11C 29/56 |

* cited by examiner

MEMORY CONTROLLER, AND METHOD THEREOF

CROSS-REFERENCE TO RELATED APPLICATIONS

This application claims the benefit of the Korean Patent Applications No. 10-2019-0173306 filed on Dec. 23, 2019, which are hereby incorporated by reference as if fully set forth herein.

FIELD

The present invention relates to a memory controller for controlling a memory, and more particularly, to a memory controller having a structure capable of testing a memory in real-time using a built-in self-tester while the memory is in use, and an operation method thereof.

BACKGROUND

As the degree of integration of a memory increases, the time and cost required to test a memory increases.

Algorithms for detecting faults in a memory are largely divided into march test algorithms and a non-march test algorithms.

A march test algorithm can roughly detect faults (or errors) of a memory but has a short test time. A non-march test algorithm can accurately detect faults (or errors) of a memory but has a long test time.

A built-in self-tester (BIST) or a built-in tester is a device (or logic circuit) for performing a mechanism that permits an object to be tested by itself.

In the case of testing a semiconductor chip using an expensive external apparatus, the test cost increases. In the case of embedding a BIST or BIT into a semiconductor chip, the test cost decreases, but the BIST or BIT becomes redundant after the test. Also, since the BIST or BIT is embedded into the semiconductor chip, the size of the semiconductor chip increases.

SUMMARY

Accordingly, a technical object to be achieved by the present invention is to provide a memory controller capable of testing a memory in real time while the memory is in use by using a main controller configured to control the memory as a controller of a BIST, and an operation method thereof.

Also, another technical object to be achieved by the present invention is to provide a memory controller capable of allowing a user to directly input an operation command of the BIST.

A memory controller according to an embodiment of the present invention includes a built-in self-tester (BIST) configured to test a memory, a scheduler configured to change an execution order of memory commands to be transmitted to the memory, a main controller configured to control the memory, and a switch configured to connect one of an output of the scheduler and an output of the BIST to an input of the main controller in response to a control signal output from the BIST.

An operation method of a memory controller for controlling a memory according to an embodiment of the present invention includes a main controller performing a test operation on the memory using a test command output from a built-in self-tester (BIST) and the main controller controlling an operation of the memory using a first memory command output from a scheduler which changes an execution order of memory commands including the first memory command and a second memory command to be transmitted to the memory.

BRIEF DESCRIPTION OF THE DRAWINGS

A detailed description of each drawing is provided in order to more fully understand the drawings referred to in the detailed description of the present invention.

The accompanying drawings, which are included to provide a further understanding of the disclosure and are incorporated in and constitute a part of this application, illustrate embodiments of the disclosure and together with the description serve to explain the principle of the disclosure. In the drawings.

DETAILED DESCRIPTION

Terms used herein should be understood as follows.

It should be understood that the singular forms "a," "an," and "one" are intended to include the plural forms as well, unless the context clearly indicates otherwise. The terms first, second, and the like may only be used to distinguish one element from another, and thus the scope of the present invention should not be limited by these terms.

It should be understood that terms such as "comprises," "includes," or "having" do not preclude the presence or addition of one or more other features, integers, steps, operations, elements, components, or groups thereof.

The term "at least one" should be understood as including any combination obtainable from one or more related items. For example, the phrase "at least one of a first item, a second item, and a third item" may refer to each of the first item, the second item, or the third item and may also refer to any combination obtainable from two or more of the first item, the second item, and the third item.

Figure 1:
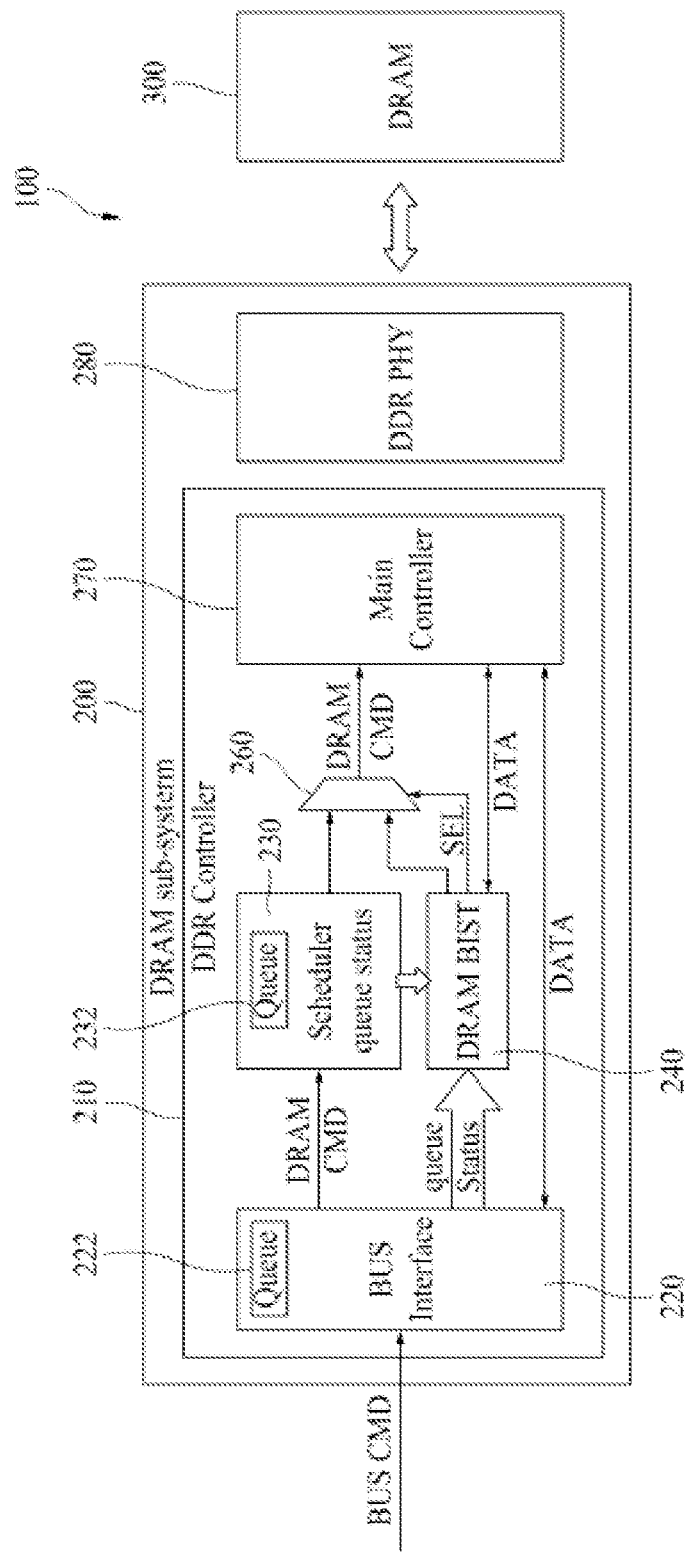
FIG. 1 is a block diagram of a memory system according to an embodiment of the present invention.

FIG. 1 is a block diagram of a memory system according to an embodiment of the present invention. Referring to FIG. 1, a memory system (or a semiconductor system) 100 included in an electronic device includes a memory subsystem 200 and a memory 300.

The electronic device includes personal computers (PCs), consumer electronics, and mobile devices. The consumer electronics include electronic devices for entertainment (e.g., flat-screen TVs, DVD players, video game consoles, virtual reality (VR) machines, remote control vehicles, etc.), electronic devices for communication (e.g., telephones, mobile phones, e-mail-capable laptops, etc.), and home electronic appliances (e.g., refrigerators, washing machines, air conditioners, desktop computers, printers, etc.), and the mobile devices include smartphones, personal digital assistants (PDAs), mobile Internet devices (MIDs), drones, and Internet of Things (IoT) devices, etc.

The memory system 100 or the memory subsystem 200 may be implemented as a system on a chip (SoC).

The memory subsystem 200 is formed as a first die (or a first chip), and the memory 300 is formed as a second die (or a second chip) different from the first die. In some embodiments, a first semiconductor package includes a first die, and a second semiconductor package includes a second die. In some embodiments, the first die and the second die may be included in one package, and the first die may be stacked on the second die.

The memory subsystem 200 may control operations (e.g., a read operation for reading data or a write operation for writing data) of the memory 300 and a test operation through data transmission lines.

The memory 300 may be a volatile memory, such as dynamic random access memory (DRAM), or a non-volatile memory, such as a flash memory. The flash memory may include a memory cell array. The memory cell array may include a two-dimensional (2D) memory cell array or a three-dimensional (3D) memory cell array.

The 3D memory cell array may include a circuit which is formed monolithically within one or more physical levels of an array of memory cells having an active region on or above a silicon substrate and which is related to operations of the memory cells. The term "monolithic" means that a layer at each level of an array is directly deposited on a layer at a corresponding underlying level of the array. The 3D memory cell array includes a vertical NAND string which is vertically oriented such that at least one memory cell is located on another memory cell. The at least one memory cell may include a charge trap layer.

Herein, embodiments in which the memory 300 is a DRAM and the memory subsystem 200 controls the DRAM are described, but the present invention is not limited thereto. The technical spirit of the present invention can be applied to a non-volatile memory, such as a flash memory, as well as a DRAM.

The memory subsystem 200 includes a memory controller (e.g., a DRAM controller) 210 and a physical layer (e.g., a DRAM physical layer) 280. The memory controller 210 may transmit or receive signals to or from the memory 300 through the physical layer 280. The memory controller 210 may use the physical layer 280 in real time for the purpose of interface training for the physical layer 280, which is used as an interface.

The memory controller 210 includes a bus interface 220, a scheduler 230, a built-in self-tester (BIST) 240, a switch 260, and a main controller (or a main DRAM controller) 270. The BIST 240 refers to an electronic circuit that performs a built-in-self-test function.

The bus interface 220 may convert a bus command BUS_CMD which is used in a bus (e.g., a system bus) into a memory command (e.g., a DRAM command (DCMD)) which is usable in a memory (e.g., the DRAM 300).

For example, the BUS command BUS_CMD may be a command suitable for the Advanced eXtensible Interface (AXI) protocol or the Advanced High-Performance Bus (AHB) protocol, but the present invention is not limited thereto.

The BUS command BUS_CMD includes information on how much data is to be written into a memory region corresponding to a certain address or how much data is to be read from the memory region. For example, the bus interface 220 converts addresses received from a bus into a row address, a bank address, and/or a column address which are used in the memory 300.

Also, since a data unit of a read operation or a write operation differs depending on the type (Dual Data Rate (DDR) 3, DDR4, a low power DDR (LPDDR) 3, LPDDR4, or the like), the bus interface 220 may change the data unit of the read operation or the write operation usable in the memory 300 on the basis of information received from the bus (e.g., information on how much data is to be read or written).

The bus interface 220 may transmit or receive data trDATA to or from the main controller 270. The data trDATA includes read data for a read operation and write data for a write operation.

The bus interface 220 includes a first queue 222 configured to store a first state signal QS1 indicating whether the bus interface 220 is currently in use (or whether there is a DRAM command to be output from the bus interface 220).

The scheduler 230 may perform an operation of changing the execution order of DRM commands in order to efficiently use the memory 300 (e.g., a re-ordering operation). A central processing unit (CPU) or a microcontroller unit (MCU) may set parameters for controlling operation of the scheduler 230 upon first execution.

For example, the memory 300 selects at least one row of a corresponding bank when performing a read operation or a write operation, pre-loads the at least one row, and then performs the read operation or the write operation on the at least one row.

Accordingly, in order to continuously process DRAM commands having the same attribute (e.g., indicating whether each command is a read command or a write command), the same bank, and the same row among a plurality of DRAM commands, the scheduler 230 may change the execution order of the DRAM commands. Thus, it is possible to increase the efficiency of the memory 300.

In response to a first indication signal IND1 including information on a DRM command that can be currently used (or processed) by the main controller 270, the scheduler 230 may determine whether to transmit a DRAM command corresponding to the information.

For example, when the scheduler 230 attempts to transmit a first DRAM command to the main controller 270, the main controller 270 may receive the first DRAM command and determine whether to perform the first DRAM command. The main controller 270 may transmit a first indication signal IND1 corresponding to a result of the determination to the scheduler 230. Thus, the scheduler 230 may determine whether to transmit the first DRAM command to the main controller 270 through the switch 260 in response to the first indication signal IND1.

Each DRAM command stored in the scheduler 230 includes the following information:

(i) Command information (e.g., information indicating whether a corresponding DRAM command is a read command, a write command, an active command, or a pre-charge command), (ii) Address information (e.g., including a bank address, a row address, and a column address for a memory region of the DRAM 300), (iii) Bus information necessary to transmit or receive data (e.g., trDATA) after a DRAM command is executed (e.g., port ID, a command queue pointer that points to a command queue, and a data queue pointer that points to a data queue).

The corresponding DRAM command is transmitted to the main controller 270 through the switch 260. The main controller 270 transmits the corresponding DRAM command to the DRAM physical layer 280.

The scheduler 230 includes a second queue 232 configured to store a second state signal QS2 indicating whether the scheduler 230 is currently in use (or whether there is a DRAM command to be output from the scheduler 230).

The BIST 240 may prestore, in a buffer 244 (see FIG. 2), a set of operation commands programmable in real time.

When a BIST control signal BIST_CTL indicating test start is input, the BIST 240 may decode at least one of the operation commands stored in the buffer 244 and generate at least one command corresponding to a result of the decoding. The BIST 240 may generate a test pattern corresponding to the generated command and test the memory 300 using the generated test pattern.

In some embodiments, the BIST 240 may determine whether at least one of the bus interface 220 and the scheduler 230 is currently in use and may generate a control signal SEL corresponding to a result of the determination.

Embodiment 1

Operation 1-1: The BIST 240 determines the second state signal QS2 of the second queue 232 included in the scheduler 230 and generates a control signal SEL according to a result of the determination. The second state signal QS2 indicates whether the scheduler 230 is in use or whether there is a DRAM command to be output from the scheduler 230.

For example, when the second state signal QS2 indicates that the scheduler 230 is not in use or that there is no DRAM command to be output from the scheduler 230, the BIST 240 may generate a control signal SEL for transmitting a test command output from the BIST 240 to the main controller 270 and then transmit the control signal SEL to the switch 260.

Operation 1-2: The main controller 270 tests the DRAM 300 according to the test command output from the BIST 240.

Operation 1-3: When the second state signal QS2 is changed to indicate that the scheduler 230 is currently in use or that there is a DRM command to be output from the scheduler 230 while the main controller 270 is testing the memory 300, the BIST 240 stops testing the DRAM 300 and generates a command to close a bank to be tested (e.g., a precharge command). The BIST 240 transmits the generated command to the main controller 270 through the switch 260, generates a control signal SEL for transmitting a DRAM command output from the scheduler 230 to the main controller 270, and transmits the control signal SEL to the switch 260.

A start address indicating a start memory region of the memory region of the memory 300 to be tested, an end address indicating an end memory region of the memory region, and an algorithm for testing the memory 300 (hereinafter referred to as "BIST algorithm") may be set for the BIST 240. In this case, according to the BIST algorithm, the BIST 240 may perform operations 1-1 to 1-3 until a test of the end memory region corresponding to the end address is finished beginning with a test of the start memory region corresponding to the start address (or until a test of the start memory region corresponding to the start address is finished beginning with a test of the end memory region corresponding to the end address).

Operation 1-4: When the second state signal QS2 indicates that the scheduler 230 is in use or that there is a DRAM command to be output from the scheduler 230, the BIST 240 may generate a control signal SEL for transmitting the DRAM command output from the scheduler 230 to the main controller 270 and then transmit the control signal SEL to the switch 260. Accordingly, the main controller 270 controls operations (e.g., a read operation or a write operation) for the memory 300 according to the DRAM command output from the scheduler 230.

Embodiment 2

Operation 2-1: The BIST 240 may determine whether the bus interface 220 is in use or whether the scheduler 230 is in use on the basis of the first state signal SQ1 of the first queue 222 included in the bus interface 220 and the second state signal QS2 of the second queue 232 of the scheduler 230. The BIST 240 generates a control signal SEL corresponding to a result of the determination. The first state signal SQ1 indicates whether the bus interface 220 is in use or whether there is a DRAM command to be output from the bus interface 220 to the scheduler 230.

For example, when the state signals SQ1 and SQ2 indicate that both of the devices 220 and 230 are not in use or that there are no DRAM commands to be output from the devices 220 and 230, the BIST 240 may generate a control signal SEL for transmitting a test command output from the BIST 240 to the main controller 270 and then transmit the control signal SEL to the switch 260.

Operation 2-2: The main controller 270 tests the memory 300 according to the test command output from the BIST 240.

Operation 2-3: When at least one of the state signals SQ1 and SQ2 is changed to indicate that at least one of the devices 220 and 230 is currently in use or that there is a DRAM command to be output from at least one of the devices 220 and 230 while the main controller 270 is testing the memory 300, the BIST 240 stops testing the memory 300 and generates a command to close a bank to be tested (e.g., a precharge command). The BIST 240 transmits the command to the main controller 270 through the switch 260, generates a control signal SEL for transmitting a DRAM command output from the scheduler 230 to the main controller 270, and transmits the control signal SEL to the switch 260.

In some embodiments, the BIST 240 may generate the control signal SEL on the basis of the first state signal SQ1.

A start address indicating a start memory region of the memory region of the memory 300 to be tested, an end address indicating an end memory region of the memory region, and a BIST algorithm for testing the memory 300 may be set for the BIST 240. In this case, according to the BIST algorithm, the BIST 240 may perform operations 2-1 to 2-3 until a test of the end memory region corresponding to the end address is finished beginning with a test of the start memory region corresponding to the start address (or until a test of the start memory region corresponding to the start address is finished beginning with a test of the end memory region corresponding to the end address).

Operation 2-4: When at least one of the state signals SQ1 and SQ2 indicates that at least one of the devices 220 and 230 is in use or that there is a DRAM command to be output from at least one of the devices 220 and 230, the BIST 240 may transmit, to the switch 260, a control signal SEL for transmitting a DRAM command output from the scheduler 230 to the main controller 270. The main controller 270 controls operations (e.g., a read operation or a write operation) for the memory 300 according to the DRAM command output from the scheduler 230.

In response to the control signal SEL generated by the BIST 240, the switch 260 connects an input (an input terminal or an input port) IP of the main controller 270 to one of an output (an output terminal or an output port) OP1 of the scheduler 230 and an output (an output terminal or an output port) OP2 of the BIST 240. For example, the switch 260 may be implemented as a selector or multiplexer.

The main controller 270 receives a DRAM command (e.g., a read command, a write command, an active command, and/or a precharge command) output from the scheduler 230 and a test command output from the BIST 240 (a precharge command in some cases) from the switch 260. The main controller 270 controls the memory 300 to perform an operation corresponding to the DRAM command through the physical layer 280 and controls the memory 300 to perform an operation corresponding to the test command through the physical layer 280.

During the test operation, the main controller 270 may test the memory 300 according to at least one test command output from the BIST 240, and thus the main controller 270 may function as a controller of the BIST 240. That is, the scheduler 230 and the BIST 240 share the main controller 270 through the switch 260.

The main controller 270 may check timing between commands output from the device 230 or 240 and/or timing between data (e.g., read data or write data) and a command (e.g., a read command or a write command). The main controller 270 may generate an indication signal IND1 and/or IND2 indicating information about what command can be received and processed and may transmit the generated indication signal to the scheduler 230 and/or the BIST 240.

For example, in the case of a write operation, the main controller 270 may receive write data to be written into the memory 300 from the bus interface 220 and write the write data into the memory 300 through the physical layer 280. In the case of a read operation, the main controller 270 may receive read data read from the memory 300 through the physical layer 280 and transmit the read data to the bus interface 220.

As described above, the scheduler 230 and the BIST 240 share the main controller 270 through the switch 260. The main controller 270 may receive, through the switch 260, the DRM command output from the scheduler 230 and control operation of the memory 300 in response to the received DRAM command. Also, the main controller 270 may receive, through the switch 260, the test command output from the BIST 240 and test the memory 300 in response to the received test command. A test command TCMD to be described with reference to FIG. 2 may include a DRAM command DRAM_CMD.

Figure 2:
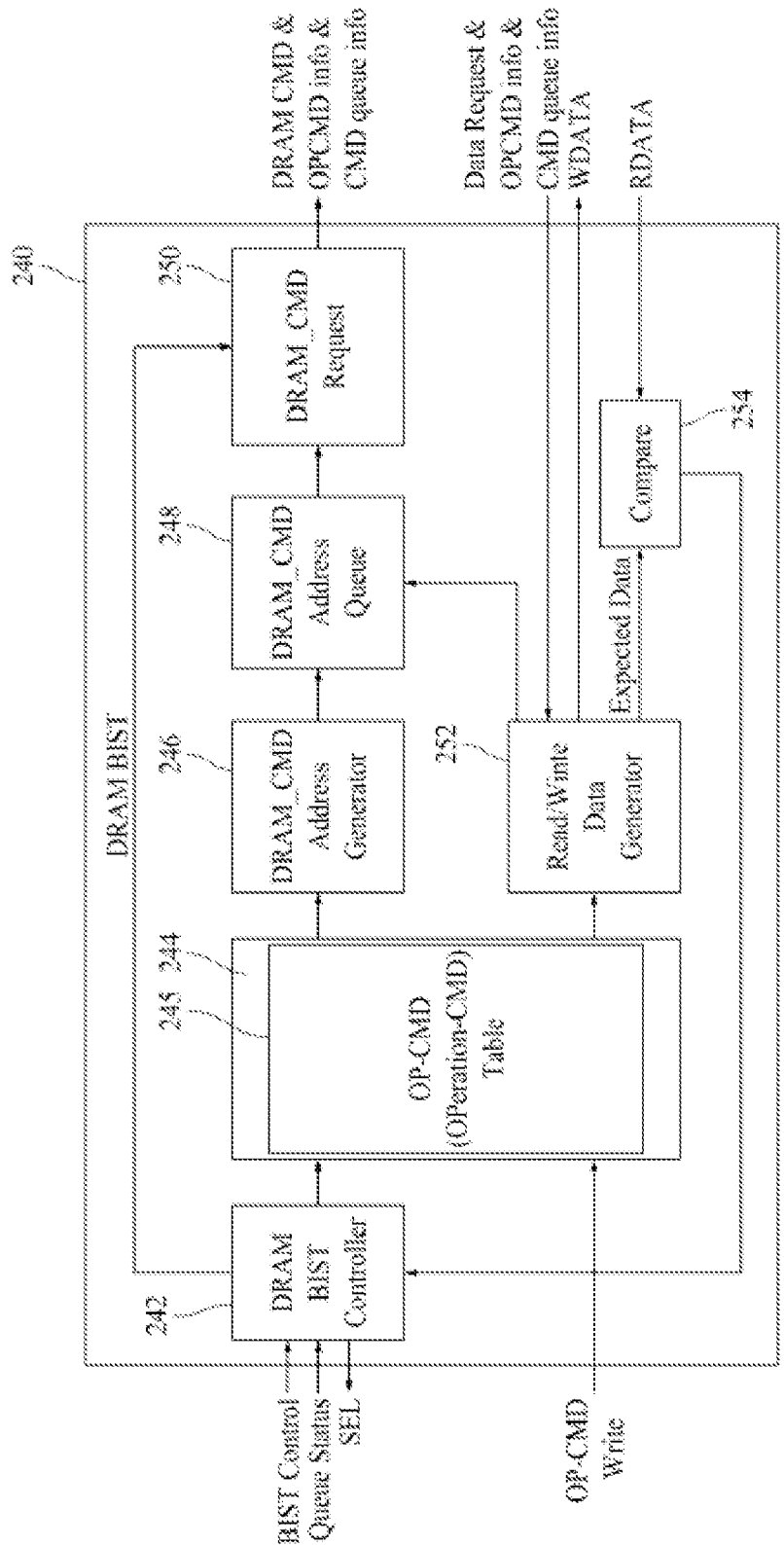
FIG. 2 is a block diagram of a built-in self-tester (BIST) included in a memory controller of a memory subsystem of FIG. 1.

FIG. 2 is a block diagram of the BIST included in the memory controller of the memory subsystem of FIG. 1.

Referring to FIGS. 1 and 2, the BIST 240 includes a BIST controller 242, a buffer (or register) 244, a command and address generator 246, a command and address queue 248, a command requester 250, a data generator 252, and a comparator 254.

The BIST controller 242 may control the overall test of the DRAM 300 in response to a BIST control signal BIST_CTL, at least one state signal (QS2 in Embodiment 1 or QS1 and QS2 in Embodiment 2), and comparison signal COMP.

The BIST control signal BIST_CTL controls the start and end of the operation of the BIST 240.

In some embodiments, as described above, the BIST controller 242 may be configured to:

(i) generate a control signal SEL in response to the second state signal QS2 indicating whether the scheduler 230 is in use or (ii) generate a control signal SEL in response to the first state signal QS1 indicating whether the bus interface 220 is in use and the second state signal QS2 indicating whether the scheduler 230 is in use.

For example, the operation of BIST controller 242 may be expressed as follows:

```
if (select 0){
    queue status = busQ status // schedulerQ status;
}else{
    queue status = schedulerQ status;
}.
```

Here, busQ status refers to the first state signal QS1 of the first queue 222, schedulerQ status refers to the second state signal QS2 of the second queue 232, status: '0 (zero)' indicates not being in use, and status: '1 (one)' indicates being in use.

As described above, not being in use may mean that the scheduler 230 is not in use in the case of Embodiment 1 and that both of the bus interface 220 and the scheduler 230 are not in use in the case of Embodiment 2.

Also, being in use may mean that the scheduler 230 is in use in the case of Embodiment 1 and that at least one of the bus interface 220 and the scheduler 230 is in use in the case of Embodiment 2.

The BIST 240, which operates in response to the BIST control signal BIST_CTL indicating the start of the BIST 240, may stop (or pause) the operation in the following cases:

(1) A case in which at least one of the bus interface 220 and the scheduler 230 is in use (in this case, the operation of the BIST 240 is stopped to separate the input IP of the main controller 270 from the output OP1 of the scheduler 230 through the switch 260), or (2) A case in which the comparison signal COMP output from the comparator 254 indicates that expected data EDATA is different from read data RDATA.

When either of the two cases in which the operation of the BIST 240 has to be stopped occurs, the BIST controller 242 may generate a stop control signal SSIG and transmit the stop control signal SSIG to the command requester 250. Accordingly, the operation of the command requester 250 is stopped in response to the stop control signal SSIG, and thus the command requester 250 may no longer generate the test command TCMD.

The BIST controller 242 outputs a pointer PNT to the command and address generator 246. The pointer PNT points to which operation command is to be read by the command and address generator 246 among operation commands stored in an operation command table 245.

The buffer (or register) 244 is a storage medium that stores the operation command table 245. Operation commands OPCMD transmitted from a CPU or a MCU through a register interface are stored in the operation command table 245.

The buffer (or register) 244 may include buffers or registers that store the operation commands OPCMD, and the registers may be flip-flops. The operation commands OPCMD are commands for operations (e.g., operations necessary to test the memory 300) of the BIST 240.

Operation commands OPCMD entered by a user are stored in the operation command table 245. A start address SADD and an end address EADD entered by a user are transmitted to the command and address generator 246, and a user data pattern UDP entered by the user is transmitted to the data generator 252.

The command and address generator 246 receives and decodes an operation command pointed to by the pointer PNT among the operation commands stored in the operation command table 245 and stores (or sequentially stores) commands generated according to a result of the decoding in the command and address queue 248.

For example, when the start address SADD is 0 and the end address EADD is 2, the command and address generator 246 may generate the following commands and store the generated commands in the command and address queue 248.

A write command to write pattern "0" into address 0,
A write command to write pattern "0" into address 1,
A write command to write pattern "0" into address 2,
A read command to read pattern "0" from address 0,
A read command to read pattern "0" from address 1,
A read command to read pattern "0" from address 2,
A write command to write pattern "1" into address 2,
A write command to write pattern "1" into address 1,
A write command to write pattern "1" into address 0,
A read command to read pattern "1" from address 2,
A read command to read pattern "1" from address 1,
A read command to read pattern "1" from address 0.

The command requester 250 requests (or sequentially requests) transmission of commands stored in the command and address queue 248 and generates a test command TCMD including the commands transmitted from the command and address queue 248 and outputs (or sequentially outputs) the test command TCMD to the switch 260 according to the request.

Since the command and address queue 248 is present in the BIST 240, the command requester 250 may output the test command TCMD including the command stored in the command and address queue 248 to the main controller 270 although no data is input.

For example, in response to a read command or a write command, the command requester 250 may read commands in the order in which the commands were stored in the command and address queue 248, generate a test command TCMD including the read commands, and transmit the test command TCMD to the main controller 270. Also, an active command and a precharge command may pre-request a command (or commands) necessary for the command and address queue 248 whenever necessary to reduce an active-to-read time or an active-to-write time.

The test command TCMD output from the command requester 250 includes the following information:

(i) Command information (e.g., information indicating whether a corresponding DRAM command DRAM_DRAM is a read command, a write command, an active command, or a pre-charge command), (ii) Address information (e.g., including a bank address, a row address, and a column address of the DRAM 300), (iii) Bus information (e.g., including a port ID, a command queue pointer indicating a command queue, and a data queue pointer indicating a data queue).

Command queue information CMDQI is included in the command queue pointer of the bus information. The command queue information CMDQI is information indicating in which queue of the command and address queue 248 a currently output command DRAM_CMD is generated and includes location information of the queue.

Operation command information OPCMDI is included in the data pointer of the bus information. The operation command information OPCMDI includes location information indicating a location where an operation command corresponding to the currently output command DRAM_CMD is stored in the operation command table 245.

The data generator 252 generates a data pattern WDATA or EDATA in response to a user data pattern UDP and/or command information REQ.

The data generator 252 receives the command information REQ, the command queue information CMDQI, and the operation command information OPCMDI from the main controller 270. Since the data generator 252 does not have a queue structure, the data generator 252 can directly generate necessary data (e.g., write data WDATA or expected data EDATA) at a necessary time according to control of the main controller 270 (e.g., using the command information REQ and the operation command information OPCMDI).

For example, when the command output from the main controller 270 (e.g., a command corresponding to the command DRAM_CMD output from the command requester 250) is a write command, the command information REQ may include information for generating and transmitting write data WDATA.

Also, when the command output from the main controller 270 (e.g., a command corresponding to the command DRAM_CMD output from the command requester 250) is a read command, the command information REQ may include information for making a request to receive read data RDATA.

As described above, the command queue information CMDQI may include information indicating to which queue the current command DRAM_CMD related to the processing of the data WDATA or RDATA corresponds among queues of the command and address queue 248. Also, the operation command information OPCMDI may include information on which operation command the current command DRAM_CMD related to the processing of the data WDATA or RDATA is generated from among the operation commands stored in the operation command table 245.

When the data generator 252 completes an operation (e.g., a read operation or a write operation) corresponding to the command information REQ, generates a completion signal IND3, and transmits the completion signal IND3 to the command and address queue 248, the command and address queue 248 clears a queue that stores a command related to the operation in response to the completion signal IND3. The command and address queue 248 stores a new command transmitted from the command and address generator 246 in the cleared queue. The completion signal IND3 includes command queue information CMDQI indicating the queue that stores the command related to the operation.

For example, the data generator 252 may generate a data pattern WDATA or EDATA with reference to a data field of an operation command corresponding to the operation command information OPCMDI among the operation commands stored in the operation command table 245.

When the command output from the main controller 270 (e.g., a command corresponding to the command TCMD output from the command requester 250) is a write command, the data generator 252 may generate write data WDATA using the operation command information OPCMDI and/or the user data pattern UDP and transmit the write data WDATA to the main controller 270.

When the command output from the main controller 270 (e.g., a command corresponding to the command TCMD output from the command requester 250) is a read command, the data generator 252 may generate expected data EDATA using the operation command information OPCMDI and/or the user data pattern UDP and transmit the expected data EDATA to the comparator 254.

During a read operation based on the read command, the comparator 254 compares the expected data EDATA to the read data RDATA, generates a comparison signal COMP indicating the success and failure of the test of the memory 300, and outputs the comparison signal COMP to the BIST controller 242.

When the expected data EDATA and the read data RDATA are different from each other, that is, when a test error for the DRAM 300 occurs, the comparator 254 generates a comparison signal COMP indicating the mismatch between the expected data EDATA and the read data RDATA and outputs the comparison signal COMP to the BIST controller 242. In response to the comparison signal COMP indicating the mismatch, the BIST controller 242 generates a stop control signal SSIG for stopping the operation of the command requester 250 and transmits the stop control signal SSIG to the command requester 250.

The BIST controller 242 transmits an address corresponding to the command that is in execution when the test error occurs (e.g., an address stored in the command and address queue 248), the expected data EDATA, and the read data RDATA to the bus interface 220. Accordingly, a user who tests the memory 300 may confirm the address corresponding to the test error, the expected data EDATA, and the read data RDATA through a device connected to the bus interface 220.

When the expected data EDATA and the read data RDATA are identical to each other, the comparator 254 outputs a comparison signal COMP indicating the match between the expected data EDATA and the read data RDATA to the BIST controller 242. Accordingly, the BIST controller 242 may continue to perform the operation related to the test of the DRAM 300.

Figure 3:
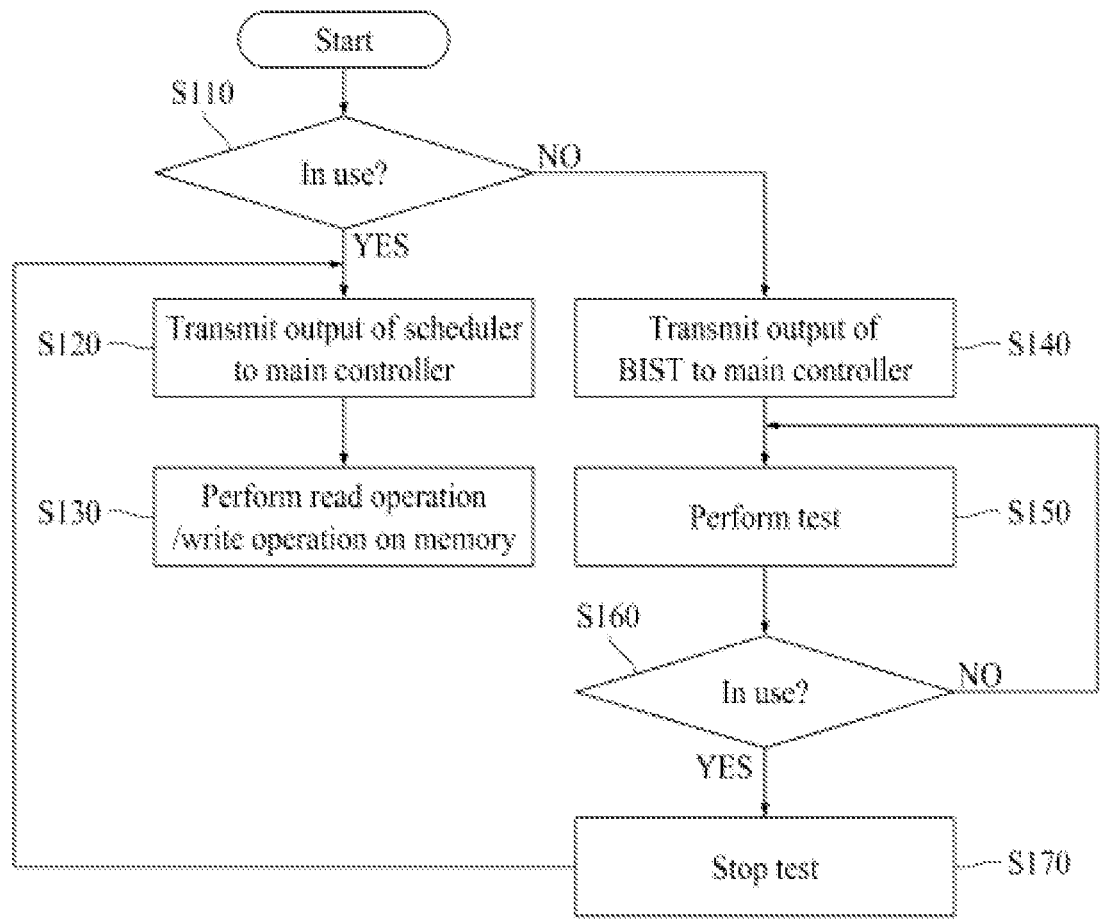
FIG. 3 is a flowchart illustrating operation of a memory system shown in FIG. 1.

FIG. 3 is a flowchart illustrating operation of the memory system shown in FIG. 1.

Referring to FIGS. 1 to 3, the BIST 240 determines whether the bus interface 220 and/or the scheduler 230 is in use on the basis of the first state signal SQ1 of the bus interface 220 and the second state signal QS2 of the scheduler 230 (S110).

When the bus interface 220 and/or the scheduler 230 is in use (yes in S110), the BIST 240 outputs a control signal SEL having a first logic state (e.g., a low state) to the switch 260. Since the switch 260 connects the output OP1 of the scheduler 230 to the input IP of the main controller 270, an output signal (e.g., a DRAM command) of the scheduler 230 is transmitted to the main controller 270 through the switch 260 (S120).

The main controller 270 performs an operation (e.g., a read operation or a write operation) on the memory 300 through the physical layer 280 in response to the output signal (e.g., the DRAM command) of the scheduler 230 (S130).

However, when both of the bus interface 220 and the scheduler 230 are not in use (no in S110), the BIST 240 outputs a control signal SEL having a second logic state (e.g., a high state) to the switch 260. Since the switch 260 connects the output OP2 of the BIST 240 to the input IP of the main controller 270, an output signal (e.g., a test command) of the BIST 240 is transmitted to the main controller 270 through the switch 260 (S140).

The main controller 270 performs a test operation on the memory 300 through the physical layer 280 in response to the output signal (e.g., the test command) of the BIST 240 (S150).

While the test operation is being performed on the memory 300, the BIST 240 determines whether the use of the bus interface 220 or the scheduler 230 is started (S160). The BIST 240 monitors whether the first state signal QS1 or the second state signal QS2 is changed.

When the use of the bus interface 220 or the scheduler 230 is started (yes in S160), the BIST 240 is stopped.

Accordingly, the test of the memory 300 is stopped, and the BIST 240 changes the logic state of the control signal SEL from the second logic state to the first logic state. In this case, the switch 260 connects the output OP1 of the scheduler 230 to the input IP of the main controller 270, and thus an output signal (e.g., a DRAM command) of the scheduler 230 is transmitted to the main controller 270 through the switch 260 (S120).

When both of the bus interface 220 and the scheduler 230 are not in use (no in S110), the BIST 240 outputs a control signal SEL for maintaining the second logic state to the switch 260, and thus an output signal (e.g., a test command) of the BIST 240 is transmitted to the main controller 270 through the switch 260 (S140). The above-described operations S110 to S170 are performed until the test is completed.

It will be understood by those skilled in the art that the present invention can be implemented in other specific forms without changing the technical spirit or essential features of the present invention.

With the memory controller according to an embodiment of the present invention, a user can directly enter an operation command for a BIST, and thus it is possible to perform all of the existing tests and also facilitate the update.

The memory controller according to an embodiment of the present invention may be used to control an operation of the memory using a main controller when the operation of the memory is performed or may use a main controller as a controller of a BIST when there is a need for a test of the memory. Thus, the BIST can test the memory in real time using the main controller while the memory is in use.

The BIST according to an embodiment of the present invention may test the memory using the main controller, and thus it is possible to decrease the size of the memory chip.

The memory controller according to an embodiment of the present invention may consecutively output commands to test a memory while the test is being performed although data corresponding to a command for the test is not input, and thus it is possible to reduce a test time.

The memory controller according to an embodiment of the present invention may generate pattern data for testing a memory whenever necessary, and thus it is possible to simplify the configuration of a logic or a logic circuit of the memory controller.

By receiving information through a bus interface, the memory controller according to an embodiment of the present invention can test a memory when an operation on the memory is not performed.

By receiving information through a bus interface, the memory controller according to an embodiment of the present invention may perform an operation of reading data from an unused memory region among memory regions of the memory or an operation of writing data into the unused memory region while an operation of accessing some regions of the memory is performed, and thus it is possible to minimize the load of the memory.

Therefore, it should be understood that the above embodiments are illustrative rather than restrictive in all respects. The scope of the present invention is shown by the following claims rather than the foregoing detailed description, and all changes or modifications derived from the meaning and scope of the claims and their equivalents should be construed as being included in the scope of the present invention.

What is claimed is:

1. A main controller comprising:
   a buffer configured to store an operation command table including operation commands entered by a user;
   a BIST (built-in self-tester) controller configured to generate a pointer pointing to an operation command;
   a command and address generator configured to decode the operation command corresponding to the pointer among the operation commands to generate first memory commands;
   a command and address queue comprising queues for storing the first memory commands; and
   a command requester configured to output a test command including first operation command information for the generation of a memory command output from a first queue included in the queues among the memory command, location information of the first queue, and the operation commands.

2. The main controller of claim 1, further comprising a data generator configured to receive command information including type information of the memory command, the location information of the first queue, and the first operation command information and generate expected data corresponding to the command information.

3. The main controller of claim 1, further comprising a comparator configured to compare the expected data generated by the data generator to read data and output a comparison signal to the BIST controller.

4. The main controller of claim 3, wherein the BIST controller generates a stop control signal for stopping the command requester in response to the comparison signal indicating mismatching between the expected data and the read data.

5. The main controller of claim 3, wherein when the comparison signal indicates mismatching between the expected data and the read data, the BIST controller transmits address information stored in the first queue, the expected data, and the read data to a bus interface.

6. The main controller of claim 3, wherein when the expected data matches the read data, the comparator outputs a comparison signal indicating matching between the expected data and the read data to the BIST controller.

7. The main controller of claim 1, further comprising:
   a scheduler configured to change an execution order of memory commands to be transmitted to the memory;
   a main controller configured to control the memory; and
   a switch configured to connect one of an output of the scheduler and an output of the command requester to an input of the main controller.

8. The memory controller of claim 7, wherein the main controller is configured to:
   receive the memory command output from the scheduler through the switch and control an operation of the memory in response to the received memory command; and
   receive the test command output from the command requester through the switch and test the memory in response to the received test command.

9. The memory controller of claim 7, wherein
   the BIST controller generates a control signal on the basis of a state signal indicating whether the scheduler is in use, and
   when the state signal indicates that the scheduler is not in use, the BIST controller generates the control signal for connecting the output of the command requester to the input of the main controller and outputs the control signal to the switch.

10. The memory controller of claim 7, wherein
    the main controller generates at least one indication signal indicating information on a processable command and transmits the generated indication signal to at least one of the scheduler and the BIST controller, and
    the at least one of the scheduler and the BIST controller determines whether to transmit the command corresponding to the information in response to the at least one indication signal.

* * * * *